United States Patent
Olander et al.

(10) Patent No.: US 9,455,147 B2
(45) Date of Patent: *Sep. 27, 2016

(54) BORON ION IMPLANTATION USING ALTERNATIVE FLUORINATED BORON PRECURSORS, AND FORMATION OF LARGE BORON HYDRIDES FOR IMPLANTATION

(71) Applicant: Entegris, Inc., Billerica, MA (US)

(72) Inventors: W. Karl Olander, Indian Shores, FL (US); Jose I. Arno, Brookfield, CT (US); Robert Kaim, Brookline, MA (US)

(73) Assignee: ENTEGRIS, INC., Billerica, MA (US)

(*) Notice: Subject to any disclaimer, the term of this patent is extended or adjusted under 35 U.S.C. 154(b) by 778 days.

This patent is subject to a terminal disclaimer.

(21) Appl. No.: 13/726,826

(22) Filed: Dec. 26, 2012

(65) Prior Publication Data

US 2013/0137250 A1    May 30, 2013

Related U.S. Application Data

(63) Continuation of application No. 12/913,757, filed on Oct. 27, 2010, now Pat. No. 8,389,068, which is a continuation of application No. 12/065,503, filed as application No. PCT/US2006/033899 on Aug. 30, 2006, now Pat. No. 7,943,204.

(60) Provisional application No. 60/712,647, filed on Aug. 30, 2005.

(51) Int. Cl.
    *C23C 14/48*     (2006.01)
    *H01L 21/265*    (2006.01)
    (Continued)

(52) U.S. Cl.
    CPC ............ *H01L 21/265* (2013.01); *H01J 37/08* (2013.01); *H01J 37/3171* (2013.01); *H01L 21/2658* (2013.01); *H01L 21/26513* (2013.01); *H01J 2237/006* (2013.01); *H01J 2237/082* (2013.01)

(58) Field of Classification Search
    CPC ............. H01J 37/08; H01J 37/3171; H01J 2237/006; H01J 2237/082; H01L 21/265; H01L 21/26513; H01L 21/2658
    USPC ....... 427/523–531, 533, 535, 536, 537, 576; 438/510–569, 766, 796, 798
    See application file for complete search history.

(56) References Cited

U.S. PATENT DOCUMENTS

| 3,472,751 A | 10/1969 | King |
| 3,602,778 A | 8/1971 | Ura et al. |

(Continued)

FOREIGN PATENT DOCUMENTS

| AL | 0079705 A1 | 5/1983 |
| CN | 1484288 A | 3/2004 |

(Continued)

OTHER PUBLICATIONS

Ziegler, J. (ED.), "Chapter 2: Advanced Technologies and Applications of Ion Implantation", "*Ion Implantation Science and Technology*", 2004, pp. 2-1-2-16, Publisher: Ion Implantation Technology Co., Published in: Edgewater, MD, US.

(Continued)

*Primary Examiner* — Marianne L Padgett
(74) *Attorney, Agent, or Firm* — Hultquist, PLLC; Mary B. Grant; Maggie Chappuis

(57) ABSTRACT

Methods of implanting boron-containing ions using fluorinated boron-containing dopant species that are more readily cleaved than boron trifluoride. A method of manufacturing a semiconductor device including implanting boron-containing ions using fluorinated boron-containing dopant species that are more readily cleaved than boron trifluoride. Also disclosed are a system for supplying a boron hydride precursor, and methods of forming a boron hydride precursor and methods for supplying a boron hydride precursor. In one implementation of the invention, the boron hydride precursors are generated for cluster boron implantation, for manufacturing semiconductor products such as integrated circuitry.

20 Claims, 4 Drawing Sheets

(51) Int. Cl.
*H01J 37/08* (2006.01)
*H01J 37/317* (2006.01)

(56) References Cited

U.S. PATENT DOCUMENTS

| | | | |
|---|---|---|---|
| 3,615,203 A | 10/1971 | Kaneko et al. | |
| 3,625,749 A | 12/1971 | Yoshioka et al. | |
| 3,658,586 A | 4/1972 | Wang | |
| 3,725,749 A | 4/1973 | Groves et al. | |
| 3,893,769 A | 7/1975 | Woolley | |
| 3,960,605 A | 6/1976 | Beck et al. | |
| 4,100,310 A | 7/1978 | Ura et al. | |
| 4,128,733 A | 12/1978 | Fraas et al. | |
| 4,331,647 A | 5/1982 | Goldenberg | |
| 4,348,376 A | 9/1982 | Goldenberg | |
| 4,369,031 A | 1/1983 | Goldman et al. | |
| 4,600,801 A | 7/1986 | Guha et al. | |
| 4,619,729 A | 10/1986 | Johncock et al. | |
| 4,657,774 A | 4/1987 | Satou et al. | |
| 4,680,358 A | 7/1987 | Yu | |
| 4,722,978 A | 2/1988 | Yu | |
| 4,803,292 A | 2/1989 | Ohfune et al. | |
| 4,814,842 A | 3/1989 | Nakagawa et al. | |
| 4,851,255 A | 7/1989 | Lagendijk et al. | |
| 4,883,969 A | 11/1989 | Ishida et al. | |
| 4,942,246 A | 7/1990 | Tanaka et al. | |
| 5,061,322 A | 10/1991 | Asano | |
| 5,436,180 A | 7/1995 | de Fresart et al. | |
| 5,443,732 A | 8/1995 | Lahoda et al. | |
| 5,497,006 A | 3/1996 | Sferlazzo et al. | |
| 5,516,366 A | 5/1996 | Kanno et al. | |
| 5,518,528 A | 5/1996 | Tom et al. | |
| 5,704,965 A | 1/1998 | Tom et al. | |
| 5,704,967 A | 1/1998 | Tom et al. | |
| 5,707,424 A | 1/1998 | Tom et al. | |
| 5,761,910 A | 6/1998 | Tom et al. | |
| 5,834,371 A | 11/1998 | Ameen et al. | |
| 5,837,027 A | 11/1998 | Olander et al. | |
| 5,851,270 A | 12/1998 | Olander | |
| 5,916,245 A | 6/1999 | Tom | |
| 5,935,293 A | 8/1999 | Detering et al. | |
| 5,935,305 A | 8/1999 | Tom et al. | |
| 5,943,594 A | 8/1999 | Bailey et al. | |
| 5,977,552 A | 11/1999 | Foad | |
| 5,993,766 A | 11/1999 | Tom et al. | |
| 6,077,355 A | 6/2000 | Yamashita et al. | |
| 6,080,297 A | 6/2000 | Ayers | |
| 6,083,298 A | 7/2000 | Wang et al. | |
| 6,086,837 A | 7/2000 | Cowan et al. | |
| 6,089,027 A | 7/2000 | Wang et al. | |
| 6,096,467 A | 8/2000 | Shimizu et al. | |
| 6,101,816 A | 8/2000 | Wang et al. | |
| 6,132,492 A | 10/2000 | Hultquist et al. | |
| 6,135,128 A | 10/2000 | Graf et al. | |
| 6,204,180 B1 | 3/2001 | Tom et al. | |
| 6,333,272 B1 | 12/2001 | McMillin et al. | |
| 6,343,476 B1 | 2/2002 | Wang et al. | |
| 6,346,452 B1 | 2/2002 | Kabir et al. | |
| 6,376,664 B1 | 4/2002 | Chan et al. | |
| 6,406,519 B1 | 6/2002 | Tom et al. | |
| 6,420,304 B1 | 7/2002 | Tsai et al. | |
| 6,486,227 B2 | 11/2002 | Nohr et al. | |
| 6,592,653 B2 | 7/2003 | Wang et al. | |
| 6,600,092 B2 | 7/2003 | Lee | |
| 6,660,063 B2 | 12/2003 | Tom et al. | |
| 6,730,568 B2 | 5/2004 | Sohn | |
| 6,740,586 B1 | 5/2004 | Wang et al. | |
| 6,743,278 B1 | 6/2004 | Carruthers | |
| 6,772,781 B2 | 8/2004 | Doty et al. | |
| 6,780,896 B2 | 8/2004 | MacDonald et al. | |
| 6,802,294 B2 | 10/2004 | Osman | |
| 6,835,414 B2 | 12/2004 | Ramm | |
| 6,852,610 B2 | 2/2005 | Noda | |
| 6,868,869 B2 | 3/2005 | Olander | |
| 6,872,639 B2 | 3/2005 | DeBoer et al. | |
| 6,885,057 B2 | 4/2005 | Osada et al. | |
| 6,893,907 B2 | 5/2005 | Maydan et al. | |
| 6,905,947 B2 | 6/2005 | Goldberg | |
| 6,909,839 B2 | 6/2005 | Wang et al. | |
| 6,921,062 B2 | 7/2005 | Gregg et al. | |
| 6,939,769 B2 | 9/2005 | Oh | |
| 6,998,626 B1 | 2/2006 | Ryding et al. | |
| 7,094,670 B2 | 8/2006 | Collins et al. | |
| 7,138,768 B2 | 11/2006 | Maciejowski et al. | |
| 7,144,809 B2 | 12/2006 | Elers et al. | |
| 7,300,038 B2 | 11/2007 | Gregg et al. | |
| 7,397,048 B2 | 7/2008 | Singh et al. | |
| 7,473,606 B2 | 1/2009 | Hsiao et al. | |
| 7,518,124 B2 | 4/2009 | Goldberg | |
| 7,641,879 B2 | 1/2010 | Spielvogel et al. | |
| 7,666,770 B2 | 2/2010 | Sasaki et al. | |
| 7,759,657 B2 | 7/2010 | Tieger et al. | |
| 7,825,016 B2 | 11/2010 | Giles | |
| 7,833,886 B2 | 11/2010 | Giles et al. | |
| 7,919,402 B2 | 4/2011 | Jacobson et al. | |
| 7,943,204 B2 * | 5/2011 | Olander | H01J 37/08 427/523 |
| 7,947,129 B2 | 5/2011 | Murata et al. | |
| 7,947,582 B2 | 5/2011 | Hautala et al. | |
| 8,013,312 B2 | 9/2011 | Adams | |
| 8,062,965 B2 * | 11/2011 | Kaim | C01B 35/061 438/513 |
| 8,187,971 B2 | 5/2012 | Russell et al. | |
| 8,237,136 B2 | 8/2012 | Hautala et al. | |
| 8,252,651 B2 | 8/2012 | Kawasaki | |
| 8,389,068 B2 * | 3/2013 | Olander | H01J 37/08 427/523 |
| 8,598,022 B2 * | 12/2013 | Kaim | C01B 35/00 257/E21.334 |
| 8,603,252 B2 | 12/2013 | Dimeo et al. | |
| 8,796,131 B2 * | 8/2014 | Jones | H01J 37/08 257/E21.043 |
| 9,111,860 B2 * | 8/2015 | Jones | H01J 37/08 |
| 9,142,387 B2 * | 9/2015 | Kaim | C01B 35/00 |
| 9,205,392 B2 * | 12/2015 | Byl | B01J 8/0285 |
| 2002/0014407 A1 | 2/2002 | Allen et al. | |
| 2002/0018897 A1 | 2/2002 | Kuckertz et al. | |
| 2002/0130278 A1 | 9/2002 | Vella | |
| 2002/0145711 A1 | 10/2002 | Magome et al. | |
| 2002/0155724 A1 | 10/2002 | Sakai et al. | |
| 2003/0003668 A1 | 1/2003 | Oh | |
| 2003/0019580 A1 | 1/2003 | Strang | |
| 2003/0023118 A1 | 1/2003 | Kanayama et al. | |
| 2003/0203608 A1 | 10/2003 | Deboer et al. | |
| 2003/0216014 A1 | 11/2003 | Goldberg | |
| 2004/0002202 A1 | 1/2004 | Horsky et al. | |
| 2004/0018746 A1 | 1/2004 | Arno | |
| 2004/0053457 A1 | 3/2004 | Sohn | |
| 2004/0083962 A1 | 5/2004 | Bang et al. | |
| 2004/0110351 A1 | 6/2004 | Narasimha | |
| 2004/0166612 A1 | 8/2004 | Maydan et al. | |
| 2004/0235280 A1 | 11/2004 | Keys et al. | |
| 2005/0035284 A1 | 2/2005 | Schultz et al. | |
| 2005/0051096 A1 | 3/2005 | Horsky et al. | |
| 2005/0163693 A1 | 7/2005 | Spielvogel et al. | |
| 2005/0169827 A1 | 8/2005 | Spielvogel et al. | |
| 2005/0176832 A1 | 8/2005 | Tonkovich et al. | |
| 2005/0181621 A1 * | 8/2005 | Borland | H01L 21/265 438/752 |
| 2005/0191816 A1 | 9/2005 | Vanderpool et al. | |
| 2005/0202657 A1 | 9/2005 | Borland et al. | |
| 2006/0086376 A1 | 4/2006 | Dimeo, Jr. et al. | |
| 2006/0097193 A1 | 5/2006 | Horsky et al. | |
| 2006/0102464 A1 | 5/2006 | Tillotson | |
| 2006/0104851 A1 | 5/2006 | Tillotson | |
| 2006/0174941 A1 | 8/2006 | Cohen et al. | |
| 2006/0264051 A1 | 11/2006 | Thibaut | |
| 2007/0059848 A1 * | 3/2007 | Sasaki | H01L 21/265 438/14 |
| 2007/0148888 A1 | 6/2007 | Krull et al. | |
| 2007/0178679 A1 | 8/2007 | Hatem et al. | |
| 2007/0217967 A1 | 9/2007 | McDermott et al. | |
| 2007/0278417 A1 | 12/2007 | Horsky et al. | |
| 2008/0138967 A1 | 6/2008 | Li et al. | |

(56) References Cited

U.S. PATENT DOCUMENTS

| | | |
|---|---|---|
| 2008/0138968 A1 | 6/2008 | Porshnev et al. |
| 2008/0149929 A1 | 6/2008 | Giles |
| 2008/0248636 A1 | 10/2008 | Olander et al. |
| 2008/0305598 A1 | 12/2008 | Horsky et al. |
| 2009/0294698 A1 | 12/2009 | Ray |
| 2010/0112795 A1 | 5/2010 | Kaim et al. |
| 2010/0224264 A1 | 9/2010 | Homan et al. |
| 2011/0065268 A1 | 3/2011 | Olander et al. |
| 2011/0079241 A1 | 4/2011 | Sinha et al. |
| 2011/0097882 A1 | 4/2011 | Kaim et al. |
| 2011/0143527 A1 | 6/2011 | Platow et al. |
| 2011/0159671 A1 | 6/2011 | Kaim et al. |
| 2011/0165053 A1 | 7/2011 | Cook et al. |
| 2012/0108044 A1 | 5/2012 | Kaim et al. |
| 2012/0119113 A1 | 5/2012 | Colvin et al. |
| 2012/0252195 A1 | 10/2012 | Jones et al. |
| 2014/0301932 A1* | 10/2014 | Byl .................. C01B 35/061 423/293 |
| 2015/0357152 A1* | 12/2015 | Jones .................. H01J 37/08 222/3 |
| 2015/0380212 A1* | 12/2015 | Byl .................. H01J 37/08 250/492.3 |
| 2016/0013018 A1* | 1/2016 | Kaim .................. C01B 35/00 438/513 |
| 2016/0020102 A1* | 1/2016 | Byl .................. H01J 37/08 438/22 |

FOREIGN PATENT DOCUMENTS

| | | |
|---|---|---|
| CN | 1917947 A | 2/2007 |
| CN | 101384747 A | 3/2009 |
| EP | 0385709 B1 | 5/1995 |
| EP | 0656668 B1 | 3/1999 |
| JP | 58-8071 A | 1/1983 |
| JP | 62095820 A | 5/1987 |
| JP | 63-15228 A | 1/1988 |
| JP | 63-48730 A | 3/1988 |
| JP | 6438700 A | 2/1989 |
| JP | 64-83147 A | 3/1989 |
| JP | 1-225117 A | 9/1989 |
| JP | 3165443 A | 7/1991 |
| JP | 5106038 A | 4/1993 |
| JP | 5-254808 A | 10/1993 |
| JP | 6-80681 A | 3/1994 |
| JP | 6-204160 A | 7/1994 |
| JP | 6-204516 A | 7/1994 |
| JP | 7065761 A | 3/1995 |
| JP | 7-90201 A | 4/1995 |
| JP | 7299304 A | 11/1995 |
| JP | 8288233 A | 11/1996 |
| JP | 9-298166 A | 11/1997 |
| JP | 10-251592 A | 9/1998 |
| JP | 2001-332509 A | 11/2001 |
| JP | 2002-348381 A | 12/2002 |
| JP | 2004-363050 A | 12/2004 |
| JP | 2009-506580 A | 2/2009 |
| JP | 2011-502923 A | 1/2011 |
| KR | 1020060070456 A | 6/2006 |
| TW | 200832523 A | 8/2008 |
| TW | 200848650 A | 12/2008 |
| WO | 9811764 A1 | 3/1998 |
| WO | 03057667 A2 | 7/2003 |
| WO | 03100806 A1 | 12/2003 |
| WO | 2004003973 A2 | 1/2004 |
| WO | 2004003990 A1 | 1/2004 |
| WO | 2004053945 A2 | 6/2004 |
| WO | 2005020306 A1 | 3/2005 |
| WO | 2005027208 A1 | 3/2005 |
| WO | 2005059942 A2 | 6/2005 |
| WO | 2005114692 A2 | 12/2005 |
| WO | 2006095086 A2 | 9/2006 |
| WO | 2007027798 A2 | 3/2007 |
| WO | 2007056249 A1 | 5/2007 |
| WO | 2007087212 A1 | 8/2007 |
| WO | 2007127865 A2 | 11/2007 |
| WO | 2007134183 A2 | 11/2007 |
| WO | 2012030679 A2 | 3/2012 |

OTHER PUBLICATIONS

Koivisto, H., et al., "The first results with new JYFL 14 GHz ECR ion source", "Nuclear Instruments and Methods in Physics Research B", 2001, pp. 379-384, vol. 174.

Hayton, L., et al., "An ESR study of the reaction of silver atoms with B2F4 under matrix isolation conditions", "J. Chem. Soc., Dalton Trans.", Mar. 8, 2002, pp. 1327-1329.

Wilson, R., et al., "Comparison of Sources of Boron, Phosphorus, and Arsenic Ions", "Appl. Phys. Lett.", Feb. 15, 1973, pp. 176-179, vol. 22, No. 4.

Becher, H., et al., "Vibrational Spectra of Normal, Boron-10-Enriched, and Deuteriomethylboron Difuoride", "Spectrochimica Acta Part A: Molecular Spectroscopy", 1978, pp. 141-146 (English Abstract), vol. 34, No. 2, no article supplied; only the abstract; published online Dec. 2001.

Byl, O., et al., "Properties of Diboron Tetrafluoride (B2F4), A New Gas for Boron Ion Implantation", "AIP Conference Proceedings", Jan. 1, 2011, pp. 408-410, vol. 1321.

Weast, R. (ED.), "Physical Constants of Inorganic Compounds—Boric Acid", "Handbook of Chemistry and Physics, 56th Edition", Sep. 1975, pp. B-78, Publisher: CRC Press, Inc.

Weast, R. (ED.), "Vapor Pressure Inorganic Compounds", "Handbook of Chemistry and Physics, 56 Ed.", Sep. 1975, pp. D-183-D-188, Publisher: CRC Press, Inc.

"Webster's Ninth New Collegiate Dictionary", 1990, p. 578 Publisher: Merriam-Webster Inc., Published in: Springfield, Massachusetts, US.

Yu, J., et al., "Isotopically Enriched 10BN Nanotubes", "Advanced Materials", Jul. 2006, pp. 2157-2160, vol. 18.

Timms, P., "Boron-Fluorine Chemistry. I. Boron Monofluoride and Some Derivatives", "Journal of the American Chemical Society", Mar. 29, 1967, pp. 1629-1632, vol. 89, No. 7.

* cited by examiner

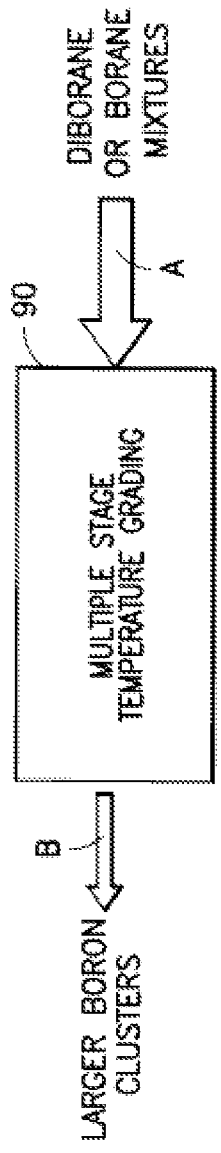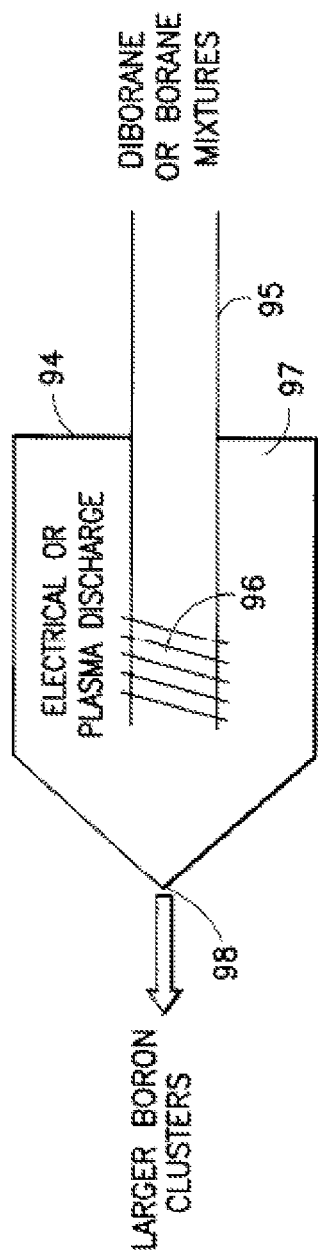

BORON ION IMPLANTATION USING ALTERNATIVE FLUORINATED BORON PRECURSORS, AND FORMATION OF LARGE BORON HYDRIDES FOR IMPLANTATION

CROSS-REFERENCE TO RELATED APPLICATIONS

This application is a continuation under 35 USC 120 of U.S. patent application Ser. No. 12/913,757 filed Oct. 27, 2010, and published on Mar. 17, 2011 as US 2011-0065268A1, which is a continuation under 35 USC 120 of U.S. patent application Ser. No. 12/065,503 filed Feb. 29, 2008, and issued on May 17, 2011 as U.S. Pat. No. 7,943,204, which in turn claims priority under the provisions of 35 USC §371 of International Application No. PCT/US06/33899 filed Aug. 30, 2006, which in turn claims benefit under 35 USC 119(e) of U.S. Provisional Patent Application No. 60/712,647 filed Aug. 30, 2005. The disclosures of such U.S. and international applications are hereby incorporated herein by reference in their respective entireties, for all purposes.

FIELD OF THE INVENTION

The present invention relates to improved methods of implanting boron, particularly to methods of implanting boron-containing ions using boron-containing dopant species that are more readily cleaved than boron trifluoride, and compositions for use in same. The invention also relates to a process for supplying a boron hydride precursor, to a method of forming a boron hydride precursor and to a source of boron hydride precursor.

DESCRIPTION OF THE RELATED ART

Ion implantation is used in integrated circuit fabrication to accurately introduce controlled amounts of dopant impurities (e.g., boron) into microelectronic device wafers and is a crucial process in microelectronic/semiconductor manufacturing. In such implantation systems, an ion source ionizes a desired dopant element gas ("the feedstock") and the ions are extracted from the source in the form of an ion beam of desired energy. Extraction is achieved by applying a high voltage across suitably shaped extraction electrodes, which incorporate apertures for passage of the extracted beam. The ion beam is then directed at the surface of the workpiece, such as a microelectronic device wafer, in order to implant the workpiece with the dopant impurity and form a region of desired conductivity. Then, the implanted dopant atoms are activated by annealing to form an electrically active doped region.

Presently, there are upwards of 10-15 implantation steps in the fabrication of state of the art devices. Increasing wafer sizes, decreasing critical dimensions, and growing circuit complexity are placing greater demands on ion implant tools, with respect to better process control, the deliverance of high beam currents at low energies, and a decrease in the mean time between failures (MTBF).

Boron trifluoride ($BF_3$) has traditionally been the source of boron dopant impurities. However, $BF_3$ is problematic in that it requires a significant amount of energy to break the B—F bonds (757 kJ mole$^{-1}$) compared to other dopant species commonly used in ion implantation (e.g., As—H=274 kJ mole$^{-1}$ and P—H=297 kJ mole$^{-1}$). As a result, ion sources must run at high arc voltages when implanting boron. High arc voltages create high energy ions that bombard the hot filament or cathode in the ion source region, contributing to sputter erosion and failure of the cathode.

It was previously reported that nominally 80% of the $BF_3$ dopant supplied to an ion implanter was vented intact, suggesting that either the $BF_3$ was not ionized or, if so, the fragments recombined. Clearly, the low ionization of $BF_3$ at high arc voltages exacerbates an already highly inefficient process.

Thus, there is a continuing need for providing alternative boron-containing dopant precursors for use as the boron element gas so as to increase the MTBF, the process efficiency and the life of the tool and to decrease the buildup of nonvolatile species at the ion source region.

Boron cluster implantation is a method for increasing ion implant efficiency at an energy level lower than that required for implant utilizing boron trifluoride. Typical methods of boron cluster implantation use decaborane (B10) and octadecaborane (B18) boron hydride precursors. These precursors are solid at room temperature and have relatively low vapor pressures. Use of these precursors involves sublimation of the precursor material from a remote container and transfer of the resulting vapor along fluid flow lines to a semiconductor tool for cluster implantation. These processes involve the potential adverse side effects of insufficient material flow and condensation. In order to combat the former, the vessels containing the solid sources must be heated to constant and precise temperatures. In order to prevent unwanted condensation, the lines leading to the tool need to be heat traced.

Boron cluster implantation utilizing decaborane and octadecaborane as precursors presents additional challenges, including those identified below:

heat tracing the solid container and transfer lines is costly, cumbersome, difficult to implement in an ion implanter, difficult to retrofit and prone to failure;

unbalanced heat loads can lead to condensation on cold spots that can result in clogging or uneven flow rates;

excess heat applied to the solid materials can lead to decomposition resulting in impurities and uneven flow rates;

the flow rate of sublimed materials depends on the available surface area on the vaporizer. Over time, as a solid is depleted and recrystallized, the surface area of the vaporizer decreases, leading to a drop in flow rate over the lifetime of the charged vaporizer;

metering the amount of material in the tool is very difficult and is based solely on vapor pressure;

controlling delivery of the material to the tool is difficult and costly;

the decaborane and octadecaborane materials are expensive; and installation of the vaporizer adjacent to the ion source, often done to minimize the issues with installing heat traced transfer lines inside the implanter, is a dangerous practice that can result in safety and code concerns.

Accordingly, there is a need in the art for new systems, methods and precursors for cluster boron implantation, including a need for improved methods of delivery of precursors for cluster boron implantation to a tool for implantation, which enable easy transport of the precursor to the tool and increased boron ion implantation, as compared to traditional implantation of boron-containing ions.

SUMMARY OF THE INVENTION

The present invention relates to a method of implanting boron-containing ions using boron-containing dopant species that are more readily cleaved than boron trifluoride. More specifically, the present invention relates to improving the efficiency, the MTBF and the life of the ion source hardware using boron-containing dopant species that are more readily cleaved than boron trifluoride.

In one aspect, the present invention relates to method of implanting boron-containing ions comprising:
  ionizing vaporized boron-containing dopant species in a vacuum chamber under ionization conditions to generate boron-containing ions; and
  accelerating the boron-containing ions by electric field to implant boron-containing ions into a device substrate, wherein the boron-containing dopant species consists essentially of species other than $BF_3$.

According to another embodiment, the boron-containing dopant species contain less than 20 wt % $BF_3$, based on the total weight of the boron-containing dopant species, preferably less than 10 wt %, more preferably less than 5 wt %, even more preferably the boron-containing dopant species are substantially free of $BF_3$. Most preferably the boron-containing dopant species are devoid of boron trifluoride.

In another aspect, the present invention relates to a method of implanting boron-containing ions comprising:
  ionizing vaporized fluorinated boron dopant species in a vacuum chamber under ionization conditions to generate boron-containing ions; and
  accelerating the boron-containing ions by electric field to implant boron-containing ions into a device substrate, wherein the fluorinated boron dopant species comprise a compound selected from the group consisting of $B_2F_4$, $B(BF_2)_3CO_3$, $BF_2CH_3$, $BF_2CF_3$, $BF_2Cl$, $BFCl_2$, $BF(CH_3)_2$, $NOBF_4$, $NH_4BF_4$, $H_2BF_7$, $H_2B_2F_6$, $H_4B_4F_{10}$, $H_2BFO_2$, $H_2B_2F_2O_3$, $H_2B_2F_2O_6$, $H_2B_2F_4O_2$, $H_3BF_2O_2$, $H_4BF_3O_2$, $H_4BF_3O_3$, $B_8F_{12}$, $B_{10}F_{12}$, and $(F_2B)_3BCO$.

Another aspect of the invention relates to compositions or reagents comprising a boron-containing dopant species, wherein said compositions or reagents are useful for boron-containing ion implantation. According to one embodiment, the compositions or reagents consist essentially of species other than $BF_3$. According to another embodiment, the boron-containing dopant species contain less than 20 wt % $BF_3$, based on the total weight of the boron-containing dopant species, preferably less than 10 wt %, more preferably less than 5 wt %, even more preferably the boron-containing dopant species are substantially free of $BF_3$. Most preferably the boron-containing dopant species are devoid of boron trifluoride. According to another embodiment, the compositions or reagents comprise boron-containing dopant species that are readily cleaved at energies less than 700 kJ/mol, preferably less than 650 kJ/mol, even more preferably less than 600 kJ/mol. According to one preferred embodiment, the fluorinated boron dopant species comprises a boron-containing compound selected from the group consisting of $B_2F_4$, $B(BF_2)_3CO_3$, $BF_2CH_3$, $BF_2CF_3$, $BF_2Cl$, $BFCl_2$, $BF(CH_3)_2$, $NOBF_4$, $NH_4BF_4$, $H_2BF_7$, $H_2B_2F_6$, $H_4B_4F_{10}$, $H_2BFO_2$, $H_2B_2F_2O_3$, $H_2B_2F_2O_6$, $H_2B_2F_4O_2$, $H_3BF_2O_2$, $H_4BF_3O_2$, $H_4BF_3O_3$, $B_8F_{12}$, $B_{10}F_{12}$, and $(F_2B)_3BCO$.

A still further aspect of the invention relates to storage and delivery vessels suitable for use in delivery of a material to an ion implant source, wherein the vessel comprises boron-containing dopant species according to the invention. According to one embodiment, the vessel is a cylinder. According to another embodiment, the vessel is a subatmospheric vessel such as those described in U.S. Pat. No. 5,518,528; U.S. Pat. No. 5,704,965; U.S. Pat. No. 5,704,967; U.S. Pat. No. 5,935,305; U.S. Pat. No. 6,406,519; U.S. Pat. No. 6,204,180; U.S. Pat. No. 5,837,027; U.S. Pat. No. 6,743,278; U.S. Pat. No. 6,089,027; U.S. Pat. No. 6,101,816; U.S. Pat. No. 6,343,476; U.S. Pat. No. 6,660,063; U.S. Pat. No. 6,592,653; U.S. Pat. No. 6,132,492; U.S. Pat. No. 5,851,270; U.S. Pat. No. 5,916,245; U.S. Pat. No. 5,761,910; U.S. Pat. No. 6,083,298; U.S. Pat. No. 6,592,653; and U.S. Pat. No. 5,707,424, which are hereby incorporated herein by reference, in their respective entireties. Preferred vessels include, but are not limited to, SDS® and VAC® delivery vessels (available from ATMI, Inc., Danbury, Conn., USA). According to another embodiment, the vessel is an ampoule such as those described in U.S. Pat. No. 6,868,869; U.S. Pat. No. 6,740,586; U.S. patent application Ser. No. 10/201,518, issued Jul. 26, 2005 as U.S. Pat. No. 6,921,062; U.S. patent application Ser. No. 10/858,509, issued Nov. 27, 2007 as U.S. Pat. No. 7,300,038; U.S. patent application Ser. No. 10/625,179, issued Jun. 21, 2005 as U.S. Pat. No. 6,909,839; U.S. patent application Ser. No. 10/028,743, issued Oct. 12, 2004 as U.S. Pat. No. 6,802,294; U.S. Provisional Patent Application Ser. No. 60/662,515; and U.S. Provisional Patent Application Ser. No. 60/662,396, which are hereby incorporated herein by reference, in their respective entireties.

In yet another aspect, the present invention relates to a method of manufacturing a microelectronic device, said method comprising ionizing vaporized fluorinated boron dopant species in a vacuum chamber under ionization conditions to generate boron-containing ions, and accelerating the boron-containing ions by electric field to implant boron-containing ions into a device substrate and optionally, assembling said microelectronic device with said device substrate, wherein the fluorinated boron dopant species consists essentially of species other than $BF_3$. More preferably, the boron-containing dopant species are substantially free of $BF_3$, and most preferably the boron-containing dopant species are devoid of boron trifluoride.

Yet another aspect of the invention relates to improved microelectronic devices, and products incorporating same, made using the methods and compositions described herein, and optionally, incorporating the microelectronic device into a product.

The invention also relates to a method of forming a boron hydride precursor and a method for supplying a boron hydride precursor. More specifically, the invention relates to boron hydride precursors generated from boron-containing gas for cluster boron implantation. Additionally the invention relates to a source of boron hydride precursor.

In one aspect the invention provides a method of forming a boron hydride precursor for cluster boron implantation. The method comprises providing a boron-containing gas and inducing conversion of the boron-containing gas to higher order boron-containing clusters.

In another aspect the invention provides a method of supplying a boron hydride precursor for cluster boron implantation. The method comprises providing a boron-containing gas, inducing conversion of the boron-containing gas to higher order boron-containing clusters and supplying the higher order boron-containing clusters to a tool for cluster boron implantation. In one embodiment, the conversion is carried out in a reactor adjacent to the tool. In another embodiment, the reactor is within the tool.

In an additional aspect, the invention relates to a boron hydride precursor source, comprising:
a boron-containing gas source;
a reactor adapted for inducing conversion of boron-containing gas from said boron-containing gas source, to higher order boron-containing clusters;
flow circuitry interconnecting the boron-containing gas source and the reactor; and
optionally a mass or pressure controller in said flow circuitry.

In another aspect, the invention relates to a microelectronic device manufacturing facility, comprising a boron hydride precursor source of the invention, and a microelectronic device manufacturing tool, coupled in flow communication with the boron hydride precursor source.

A further aspect of the invention relates to a method of manufacturing a microelectronic device, comprising cluster boron ion implantation with a cluster boron species formed by the method described above.

Yet another aspect of the invention relates to a method of cluster boron ion implantation comprising use of a cluster boron species formed by the method described above.

Other aspects, features and embodiments of the invention will be more fully apparent from the ensuing disclosure and appended claims.

DESCRIPTION OF THE DRAWINGS

FIG. 7 is a schematic representation of a multiple temperature heated reactor for use in a system of the invention.

FIG. 8 is a schematic representation of a reactor that utilizes plasma or electrical discharge and is adapted for use in a system of the invention.

DETAILED DESCRIPTION OF THE INVENTION AND PREFERRED EMBODIMENTS THEREOF

Figure 1:
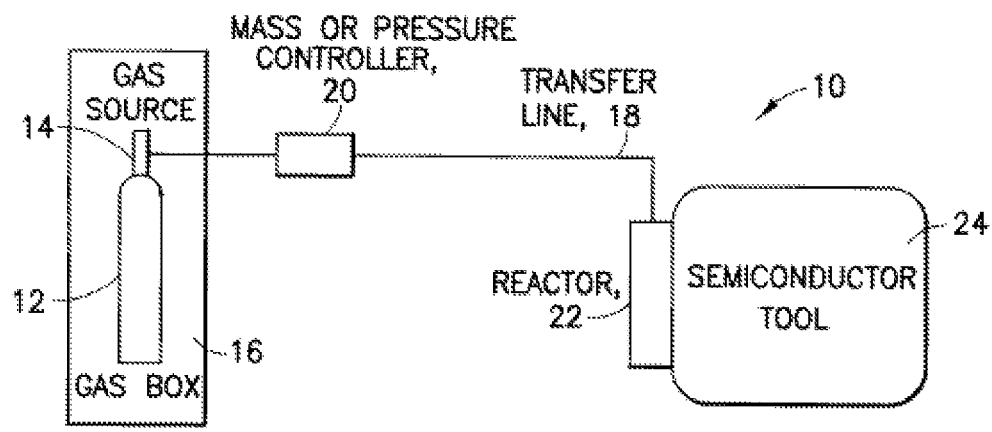
FIG. 1 is a schematic representation of a boron hydride precursor delivery system according to one embodiment of the invention.

The present invention relates to producing ion beams rich in boron-containing ions using alternative boron-containing precursors that are more readily cleaved than boron trifluoride to improve the efficiency, MTBF and the life of the ion implanter.

The present invention also relates to methods of forming a boron hydride precursor for cluster ion implantation and a method for supplying such a precursor for use in cluster ion implantation. Additionally, the invention relates to a source for boron hydride precursors.

One embodiment of the invention relates to a method of implanting boron-containing ions using boron-containing dopant species that are readily cleaved at energies less than 700 kJ/mol, preferably less than 650 kJ/mol, even more preferably less than 600 kJ/mol. The invention also relates to compositions or delivery systems containing such species.

As used herein, "ion source region" includes the vacuum chamber, the source arc chamber, the source insulators, the extraction electrodes, the suppression electrodes, the high voltage insulators and the source bushing.

As used herein, "microelectronic device" corresponds to semiconductor substrates, flat panel displays, and microelectromechanical systems (MEMS), manufactured for use in microelectronic, integrated circuit, or computer chip applications and packaging. It is to be understood that the term "microelectronic device" is not meant to be limiting in any way and includes any substrate that will eventually become a microelectronic device or microelectronic assembly.

As used herein, "precursor" includes any molecule or structure that precedes and is the source of another molecule or structure. As such a "boron precursor" is a precursor that contains boron and can be utilized as a source for boron ions in various implantation methods. Similarly, a "boron hydride precursor" is a precursor that contains a boron hydride and can be a source for boron ions in implantation.

Boron ions ($B^+$) are typically implanted to form a p-type region in a silicon substrate however, also contemplated herein is a method of manufacturing a microelectronic device having a shallow p-type doped region, by implanting molecular ions containing boron, as is well known to those skilled in the art. For example, a molecular ion such as $BF_2^+$ may be implanted in order to attain low effective boron energy at higher extracted energy of the $BF_2^+$ ion.

It has been postulated by the present inventors that lowering the bond energy of the boron-containing dopant compound will result in a concomitant lowering of the required arc voltage, thus increasing the life of the ion source.

Accordingly, one embodiment of the invention relates to a method of implanting boron-containing ions comprising ionizing a boron-containing dopant species at a high ionization efficiency of at least 15% using an arc voltage less than 100 volts, preferably less than 90 volts, more preferably less than 80 volts, and most preferably less than 70 volts, using a conventional hot cathode ion source or comparable voltages using another ion source. Towards that end, in one aspect, the present invention relates to a method of implanting boron-containing ions into a microelectronic device substrate, said method comprising vaporizing boron-containing precursor feedstock to generate vaporized boron-containing dopant species (when the boron-containing precursor feedstock is a liquid or solid), ionizing the vaporized boron-containing dopant species to generate boron-containing ions, and accelerating the boron-containing ions by electric field to implant same into the microelectronic device substrate, wherein the boron-containing precursor feedstock is devoid of substantial quantities of boron trifluoride. Preferably, the boron-containing precursor comprises a halogen species including fluorine, chlorine, bromine and iodine. More preferably, the boron-containing precursor is a fluorinated boron precursor. It is to be understood that reference to a fluorinated boron precursor hereinafter is not meant to be limiting in any way.

Boron-containing precursors contemplated herein include, but are not limited to, $B_2F_4$, $B(BF_2)_3CO_3$, $BF_2CH_3$, $BF_2CF_3$, $BF_2Cl$, $BFCl_2$, $BF(CH_3)_2$, $NOBF_4$, $NH_4BF_4$, $H_2BF_7$, $H_2B_2F_6$, $H_4B_4F_{10}$, $H_2BFO_2$, $H_2B_2F_2O_3$, $H_2B_2F_2O_6$, $H_2B_2F_4O_2$, $H_3BF_2O_2$, $H_4BF_3O_2$, $H_4BF_3O_3$, $B_8F_{12}$, $B_{10}F_{12}$, $(F_2B)_3BCO$, and combinations thereof. Alternatively, the fluorine atoms of the aforementioned boron-containing precursors may be partially or totally substituted with other halogen atoms (e.g., $BCl_3$, $BBr_3$, $B_2Cl_4$, etc.). In a particularly preferred embodiment, the boron-containing precursors include $B_2F_4$, which is expected to undergo homolytic cleavage at the B—B bond at arc voltages that are lower than that needed to cleave the B—F bond in $BF_3$. Accordingly, another embodiment of the invention relates to a method of implanting boron-containing ions comprising cleaving the boron-containing precursor at the B—B bond. Another embodiment of the invention relates to compositions or delivery systems comprising boron-containing precursors having at least one B—B bond Preferably, the alternative boron-containing precursor species require a dissociate energy in a range from about 100 kJ mole$^{-1}$ to about 650 kJ mole$^{-1}$, more preferably 300 kJ mole$^{-1}$ to about 550 kJ mole$^{-1}$.

In another embodiment, the present invention relates to a method of implanting boron-containing ions into a microelectronic device substrate, said method comprising vaporizing boron-containing precursor feedstock to generate vaporized boron-containing dopant species (when the boron-containing precursor feedstock is a liquid or solid), ionizing the vaporized boron-containing dopant species to generate boron-containing ions, and accelerating the boron-containing ions by electric field to implant same into the microelectronic device substrate, wherein the boron-containing precursor feedstock comprises boron trifluoride and at least one additional boron-containing precursor selected from the group consisting of $B_2F_4$, $B(BF_2)_3CO_3$, $BF_2CH_3$, $BF_2CF_3$, $BF_2Cl$, $BFCl_2$, $BF(CH_3)_2$, $NOBF_4$, $NH_4BF_4$, $H_2BF_7$, $H_2B_2F_6$, $H_4B_4F_{10}$, $H_2BFO_2$, $H_2B_2F_2O_3$, $H_2B_2F_2O_6$, $H_2B_2F_4O_2$, $H_3BF_2O_2$, $H_4BF_3O_2$, $H_4BF_3O_3$, $B_8F_{12}$, $B_{10}F_{12}$, $(F_2B)_3BCO$, and combinations thereof. Alternatively, the fluorine atoms of the aforementioned boron-containing precursors may be partially or totally substituted with other halogen atoms (e.g., $BCl_3$, $BBr_3$, $B_2Cl_4$, etc.).

In another embodiment, the alternative boron-containing precursor species include higher order boranes and carboranes, small nido-carboranes such as $CB_5H_9$, $C_2B_4H_8$, $C_3B_3H_7$, $C_4B_2H_6$, and $C_2B_3H_7$; open cage carboranes such as $C_2B_3H_7$, $CB_5H_9$, $C_2B_4H_8$, $C_3B_3H_7$, $C_4B_2H_6$, $C_2B_7H_{13}$; the small closo-carboranes such as $C_2B_3H_5$, $C_2B_4H_6$, $C_2B_5H_7$, $CB_5H_7$, $C_2B_6H_8$, $C_2B_7H_9$, $C_2B_8H_{10}$, $C_2B_9H_{11}$, $C_2B_{10}H_{12}$. In addition, derivatives of these carboranes may be used to modify and optimize the chemical properties of the carboranes (i.e vapor pressure, toxicity, reactivity) in combination with a fluorine source. Higher order boranes and carboranes tend to be more stable compounds than the halogenated boron-containing precursors and may provide $B_xH_y$ fragments at lower arc voltages for ion implantation. Optionally and preferably, when the boron-containing precursor species include the higher order boranes and/or carboranes, the boron-containing precursor feedstock includes at least one alternative fluorine source (e.g., $F_2$).

In yet another embodiment, the alternative boron-containing precursor may include at least one aforementioned halogenated boron-containing precursor and higher order boranes and/or carboranes, optionally in the presence of a fluorine source.

In addition to lowering the arc voltage needed to dissociate the alternative boron-containing precursors, the alternative species preferably dissociate into byproducts that are volatile and will not plate the inside of the vacuum chamber and other components of the ion source region. Further, the alternative boron-containing precursors preferably have a low carbon content (i.e., less than 3 carbon atoms per molecule, preferably less than 2, and most preferably less than 1) as carbon deposits tend to shorten the life of the ion source components.

An advantage of using fluorinated boron-containing precursors includes the generation of fluorine radicals created in the ion source, said radicals reacting with boron deposited on the walls of the ion source region components, thereby keeping said components clean. Towards that end, fluorine-containing species, e.g., $F_2$, may be introduced to the ion source region during ionization to assist with component and chamber cleaning processes when the fluorinated boron-containing dopant species do not generate enough fluorine radicals during ionization. The amount of fluorine-containing species relative to fluorinated boron-containing dopant species is readily determined by one skilled in the art. Accordingly, one embodiment of the invention relates to a method of implanting boron-containing ions using a boron-containing precursor comprising a boron-containing dopant species selected from the group consisting of $BF_3$, $BCl_3$, $BBr_3$, $B_2F_4$, $B_2Cl_2$, $B(BF_2)_3CO_3$, $BF_2CH_3$, $BF_2CF_3$, $BF_2Cl$, $BFCl_2$, $BF(CH_3)_2$, $NOBF_4$, $NH_4BF_4$, $H_2BF_7$, $H_2B_2F_6$, $H_4B_4F_{10}$, $H_2BFO_2$, $H_2B_2F_2O_3$, $H_2B_2F_2O_6$, $H_2B_2F_4O_2$, $H_3BF_2O_2$, $H_4BF_3O_2$, $H_4BF_3O_3$, $B_8F_{12}$, $B_{10}F_{12}$, $(F_2B)_3BCO$, $CB_5H_9$, $C_2B_4H_8$, $C_3B_3H_7$, $C_4B_2H_6$, $C_2B_3H_7$, $C_2B_3H_7$, $CB_5H_9$, $C_2B_4H_8$, $C_3B_3H_7$, $C_4B_2H_6$, $C_2B_7H_{13}$, $C_2B_3H_5$, $C_2B_4H_6$, $C_2B_5H_7$, $CB_5H_7$, $C_2B_6H_8$, $C_2B_7H_9$, $C_2B_8H_{10}$, $C_2B_9H_{11}$, $C_2B_{10}H_{12}$, $(Cl_2B)_3BCO$, and combinations thereof, and a fluorine-containing species (e.g., $F_2$).

In another embodiment of the invention, noble gases such as neon, argon, krypton or xenon may be co-blended with the boron-containing dopant species, or alternatively separately fed to the vacuum chamber for mixing with the boron-containing dopant species therein, thereby forming a vapor phase reagent composition. Although not wishing to be bound by theory, it is thought that the noble gases will collide with the boron-containing dopant species and assist with the disassociation of the dopant species at lower arc voltages. In addition, the co-blending of the boron-containing precursor with the noble gases makes the operating conditions more benign. Accordingly, another aspect of the invention relates to a method of implanting boron-containing ions using any boron-containing precursor (e.g., $BF_3$ or the precursors set forth above) and adding noble gases to increase the ionization efficiency. Preferably, for this aspect of the invention, the boron containing precursor is $BF_3$.

It is also contemplated herein that the feedstock includes boron trifluoride, in addition to the alternative boron-containing precursors disclosed herein. For example, the feedstock may include about 0.01 to about 90 percent by weight $BF_3$, based on the total weight of the feedstock.

In practice, liquid and/or solid boron-containing precursor feedstock is vaporized using vaporization methods well known in the art, e.g., reduced pressure, heating, etc., before or at the vacuum chamber, while gaseous precursor feedstock is introduced directly to the vacuum chamber. An ion source generates ions by introducing electrons into the vacuum chamber filled with gaseous dopant species. Several types of ion sources are commonly used in commercial ion implantation systems, including the Freeman and Bernas types using thermoelectrodes and powered by an electric arc, a microwave type using a magnetron, indirectly heated cathode sources, and RF plasma sources, all of which typically operate in a vacuum. Collisions of the electrons with the gaseous dopant species results in the creation of an ionized plasma consisting of positive and negative dopant ions. An extraction electrode with a negative or positive bias will respectively allow the positive or negative ions to pass through the aperture and out of the ion source as a collimated ion beam, which is accelerated towards the microelectronic device workpiece.

Cluster boron implantation allows an increase ion implant efficiency, relative to use of traditional boron precursors such as boron trifluoride, boron trifluoride, diborane, and the like. Implanters used in the process can work at lower energies than traditional dopant delivery processes utilizing such boron precursors. Use of cluster technology allows for delivery of multiple borons at one time. The present invention provides, in various aspects thereof, a method of forming boron hydride precursors, a source of boron hydride precursors and a method for delivering the boron hydride precursors for boron cluster implantation.

The boron hydride diborane(6) is a gas that is toxic, flammable, pyrophoric, dangerous and has a repulsive odor. It is known to decompose at room temperature, forming higher order boranes, such as $BH_3$, $B_3H_7$, $B_4H_8$, and the like. Decomposition reactions may include the following:

$B_2H_6 \rightarrow 2BH_3$;

$BH_3 + B_2H_6 \rightarrow B_3H_9$;

$B_3H_9 \rightarrow B_3H_7 + H_2$;

$B_3H_7 + B_2H_6 \rightarrow B_4H_{10} + BH_3$;

$B_4H_{10} \leftrightarrow B_4H_8 + H_2$; and $B_4H_{10} \leftrightarrow B_3H_7 + BH_3$.

Because of its high rate of decomposition, the gas is generally commercially available only at concentrations of 30% or less. The present invention utilizes this natural decomposition process and the formation of higher order boranes to generate boron hydride precursors for use in cluster boron implantation. Preferably the formation of boron hydride precursors is performed in proximity to or at the point of use of the precursors.

In one embodiment the invention provides a pressure-controlled or flow-controlled borane source, from which the borane source material is introduced as a gas to a reactor for reaction therein to form higher order boron clusters, which then are flowed to a tool for boron cluster implantation, as shown in FIG. 1.

FIG. 1 is a schematic representation of a cluster boron delivery process system 10 according to one embodiment of the invention. The boron precursor is contained in a cylindrical vessel 12 having a valve head assembly 14 secured to the upper portion of the vessel. The vessel and head valve assembly are contained in a gas box 16, in which the head valve assembly is coupled with transfer line 18. The transfer line 18 exteriorly of the gas box 16 contains a mass or pressure controller 20 therein to modulate the flow of the boron precursor vapor.

The cylindrical vessel 12 preferably contains the boron source material in a gaseous state.

Alternatively, although less preferred, the vessel may contain the boron source material in a solid state, with the vessel being heated in the gas box, to effect volatilization of the solid to form the precursor vapor. The vessel can be heated in any suitable manner (heating components and/or devices not shown in FIG. 1), e.g., by use of a heating jacket, convective heat transfer in the gas box, or in any other manner appropriate to generate the boron precursor vapor in the desired amount.

The transfer line 18 is coupled at its downstream end to a reactor 22 in which the boron precursor is submitted to process conditions effecting generation of higher order boron species, e.g., higher order boranes, such as $BH_3$, $B_3H_7$, $B_4H_8$, and the like. The reactor 22 as shown is located adjacently to the semiconductor tool 24, with the reactor in fluid supply relationship with the tool, so that the higher order boranes flow directly into the tool from the reactor.

In various aspects of the invention, the reactor may be located separate from, adjacent to or within the tool. The tool can comprise for example an ion implanter unit, or other boron precursor fluid-utilizing tool. In a preferred embodiment, the tool is a microelectronic device manufacturing tool.

In preferred practice, the borane source is a gas. Such a boron-containing gas will be easy to transport. The source material, the boron-containing gas, can be stored prior to use in any manner known to those in the art. Such storage methods can include, but are not limited to, neat gas storage, and storage of the gas in a diluted form, in inert gases such as hydrogen, argon, helium or nitrogen. Exemplary borane source gases include, but are not limited to diborane and pentaborane.

As the borane-containing gas is transferred from the supply vessel to the reactor, it preferably is passed through a controller, such as the mass or pressure controller 20 illustratively shown in FIG. 1. Such a controller may regulate mass or pressure, such that the gas remains in its desired state for delivery to the reactor. Such control is an advantage over previous methods which utilized solid material and flow through heat traced lines. Use of a controller is not required in the invention, but is highly advantageous in providing a desired flow of precursor gas to the reactor.

In addition to the borane-containing gas, an additional reactant or reactants may be supplied. Such additional reactants may be added at any point in the transfer from the gas source to the reactor, or may be added to the reactor itself. Such a reactant or reactants can for example be utilized to improve the kinetics or efficiency of the reaction or to form more complex higher order boron species. Use of such reactants can allow optimization of hydrogen to boron ratios to form desired products. For example, formation of non-volatile boron polymers can be inhibited by using a proper $H_2$ mixture that maximizes the yield of non-clogging materials.

Where diborane is the gas utilized in the present invention, the concentration of the diborane gas may range from 1000 ppm to 30% by weight. Original concentrations of a diborane gas greater than 30% are not stable in the storage container and will decompose. When a concentration of grater than 30% is desired to be provided to the reactor, a concentrator may be utilized in the line transferring the gas to the reactor.

Figure 2:
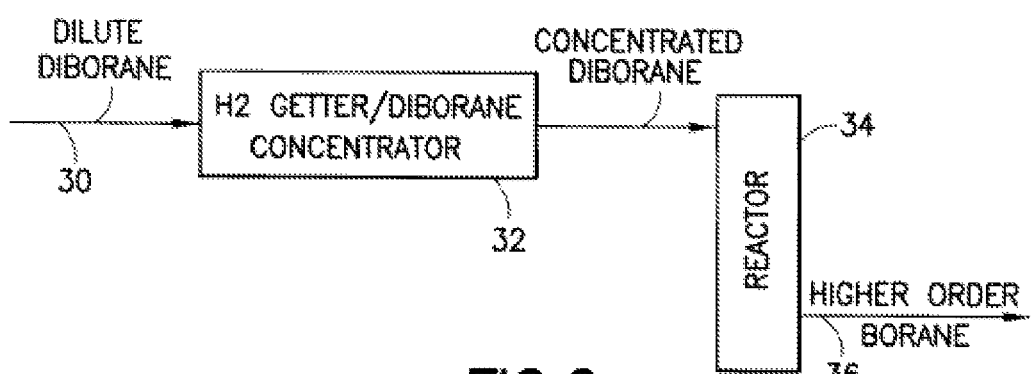
FIG. 2 is a schematic representation of an in-line diborane concentrator such as may be usefully employed in the practice of the invention.

Such a concentrator is schematically illustrated in the precursor delivery system shown in FIG. 2, in which a dilute diborane feed stream in feed line 30 is flowed to the H2 Getter/Diborane Concentrator 32, with the resulting concentrated diborane being flowed to the reactor 34 for generation therein of higher order boranes, as discharged from the reactor in discharge line 36.

In a situation where greater than 30% diborane is desired, the concentrator is utilized to reduce the amount of $H_2$ in the line. Such reduction of hydrogen can be achieved utilizing $H_2$ getters or permeation methods, e.g., with a hydrogen permselective membrane being employed for hydrogen removal from the higher order borane species.

The reactor utilized in the practice of the invention for generating higher order boranes can be located near the point of use of the resulting clusters. Such a location may be separate from, adjacent to or within the tool for use of the clusters. Within the reactor, a reaction is induced that results in the production of boron molecules with greater than 2 borons present. The temperature of the reaction within the reactor in various embodiments can be within a range of room temperature to 400° C., and pressure within the reactor in various embodiments can be within a range of vacuum to 1000 psi.

For such purpose, various types of reactors can be utilized, within the skill of the art, based on the disclosure herein. Use of any reactor that induces production of boron clusters is encompassed within the scope of the invention. Reactors that may usefully be employed in the practice of the invention include, without limitation, heated reactors, catalytic reactors, heated catalytic reactors, UV lamps, reactors with electric, microwave or radio frequency discharge or plasma, packed reactors, multiple stage heated reactors, hot plates, high pressure reactors and concentric tubular reactors. The types of reactors listed are not mutually exclusive, for example, a heated, packed, catalytic reactor (see FIG. 4) or a multiple stage heated, concentric reactor (see FIG. 5) can be used in specific embodiments of the invention.

A heated reactor usefully employed in the practice of the invention can include any reactor that is heated. Such reactor can be a heated wall reactor, a heated packed reactor, a cold wall reactor, a reactor with an internally heated section and a reactor containing multiple stage temperature grading throughout the reactor volume. A heated reactor includes any reactor where heat is utilized in induction of the reaction. Heated reactors of various types are illustratively shown in FIGS. 3-8.

A catalytic reactor usefully employed in the practice of the invention can include any reactor that accelerates the reaction within the reactor. Catalysts may be added to the reaction or may be in integrated part of the reactor itself. Catalysts may include, but are not limited to, metals such as iron, aluminum, copper, alumina, platinum, boron, carbon, carbon adsorbent and activated carbon. Where catalysts are a part of the reactor, they may be mounted to structural surfaces of the reactor, packed into the reactor as beads or pellets or the reactor may include a catalyst impregnated media with any known flow design, such as a tube, honeycomb or beading. Catalyst reactors of widely varied types may be employed.

A high pressure reactor for use in a method or system of the invention may include any reactor that allows the reaction to occur at high pressure. The high pressure may be generated by any method known to those in the art. For example, pressure within the reactor can be generated by the use of an orifice or slit at the exit region of the reactor, such that pressure is built up in the reactor for delivery of the boron-containing clusters to the semiconductor tool. Typically, when the tool is an ion implanter, the pressure within the tool will be a vacuum, e.g., subatmospheric pressure.

Figure 3:
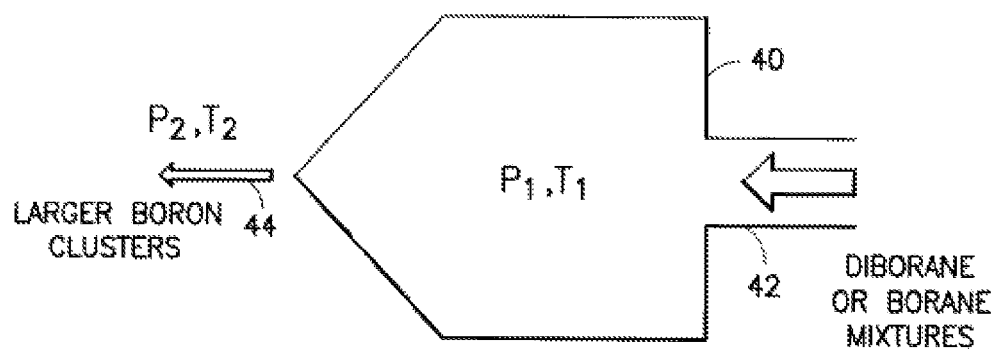
FIG. 3 is a schematic representation of a high pressure reactor, in which the high pressure is created by a constriction in the exit path, such that the boron cluster formation reaction within the reactor occurs at a higher pressure than the pressure within the tool.

FIG. 3 is a schematic representation of a high pressure reactor 40, in which the high pressure is created by a constriction in the exit path 44, such that the boron cluster formation reaction within the reactor occurs at a higher pressure than the pressure within the tool. The reactor has an inlet 42 in which diborane or borane mixtures can be introduced to the reactor interior volume, and reacted therein to form larger boron clusters that are discharged from the reactor outlet. In this reactor scheme, P1 and T1 are greater than P2 and T2.

A packed reactor for use in a method or system of the invention may include any reactor that contains packing material. The packing material can be used simply to increase the surface reaction for the reaction to occur, to improve the heat transfer, or to provide catalytic effect. The packing material may also include a catalyst impregnated media with any known flow design, such as a tube, honeycomb or beading.

Figure 4:
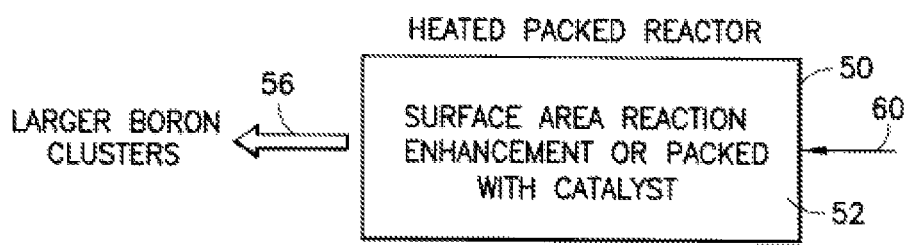
FIG. 4 is a schematic representation of a heated packed reactor such as may be usefully employed in the practice of the invention.

FIG. 4 is a schematic representation of a heated packed reactor 50 such as may be usefully employed in the practice of the invention. The reactor has an inlet 60 by which diborane or borane mixtures can be introduced into the reactor interior volume. The interior volume 52 contains a surface area reaction enhancement or is packed with catalyst, and produces larger boron clusters that are discharged from the reactor in discharge line 56.

A concentric tubular reactor for use in the invention can include any reactor that has multiple tubes. An illustrative example is shown in FIG. 5, in which multiple gases are combined for the reaction within the reactor, with the reaction occurring at a critical point in the heated zone.

Figure 5:
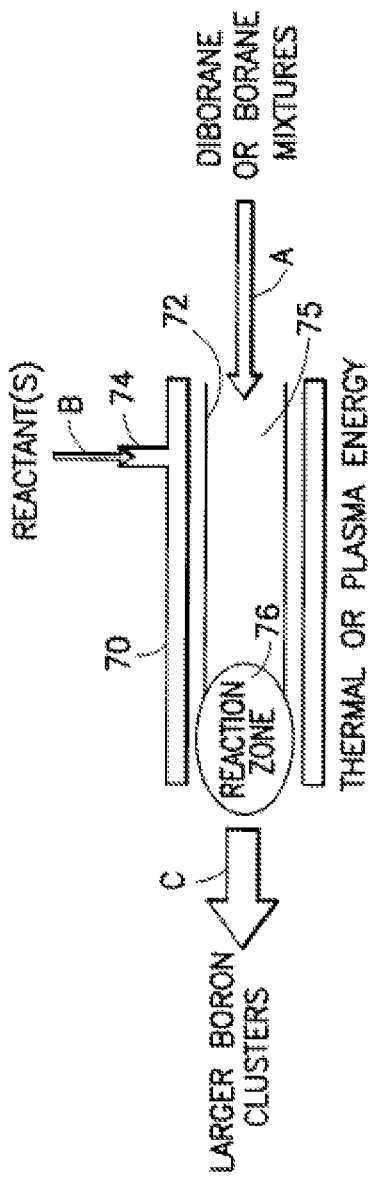
FIG. 5 is a schematic representation of a reactor with a concentric tube design such as may be usefully employed in the practice of the invention.

The reactor 70 of FIG. 5 includes an interior concentric tube 72 that is coaxial with the main casing of the reactor and defines an annular passage therebetween. The annular passage communicates in fluid flow relationship with a reactant(s) feed inlet 74 in which reactant(s) enter in the direction indicated by arrow B. Such introduced reactant(s) at the outlet end of the interior concentric tube 72 mix with the diborane or borane mixtures flowed into the tube 72 in the direction indicated by arrow A. Thermal or plasma energy is introduced to the respective fluid streams that mix in the reaction zone 76 and yield larger boron clusters that are discharged from the reactor 70 at the outlet thereof, being discharged in the direction indicated by arrow C.

A multiple stage heated reactor useful in the practice of the invention can include any reactor that has variation in temperature from one part of the reactor to another. Such reactors may include, but are not limited to, cold/hot reactors, and heated reactors with temperature grading. Such uses of temperature variations may be to maximize the efficiency of cluster conversion rates, or to control the reaction in any desirable manner. For example, the reactor can have a heated zone that is located away from the exit of the reactor, thereby minimizing clogging that might otherwise occur.

Figure 6:
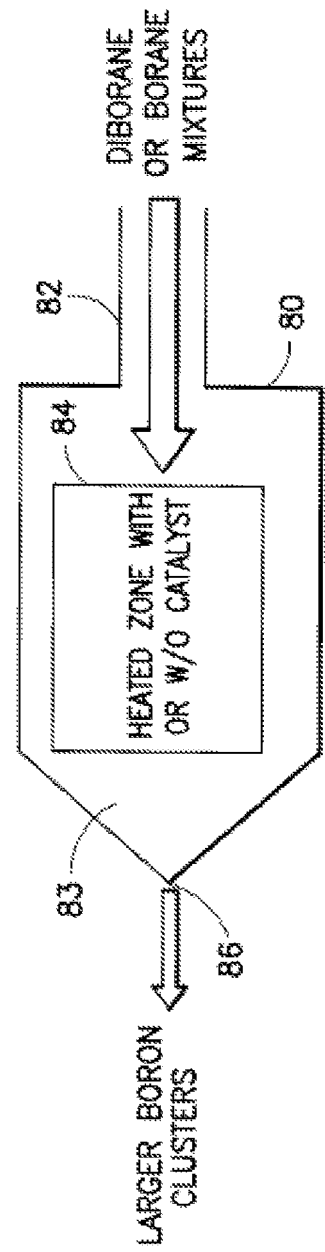
FIG. 6 is a schematic representation of a cold/hot reactor adapted for use in a system of the invention.

FIG. 6 is a schematic representation of a cold/hot reactor 80 adapted for use in a system of the invention. The reactor 80 includes an inlet 82 through which the diborane or borane mixtures are introduced to the interior volume 83 of the reactor. The interior volume 83 has a heated zone 84 therein, which may optionally contain a catalyst. The larger boron clusters produced in the reactor 80 are discharged from the reactor at outlet 86.

FIG. 7 is a schematic representation of a multiple stage heated reactor 90 for use in a system of the invention. The reactor 90 includes an inlet for introduction of diborane or borane mixtures, schematically represented by arrow A. The reactor features multiple stage temperature grading, to conduct reaction that produces the larger boron clusters that are discharged from the reactor in the outlet schematically indicated by arrow B.

FIG. 8 is a schematic representation of a reactor 94 that utilizes plasma or electrical, microwave or radio frequency discharge and is adapted for use in a system of the invention.

The reactor 94 encloses an interior volume 97 into which extends a tubular inlet passage 95 having an electrical or plasma discharge region 96 for inducing reaction producing the larger boron clusters that are discharged from the reactor outlet 98.

A hot plate may also be used as a reactor in the practice of the invention. On such a reactor, the diborane or other source gas is flash reacted by a surface induced reaction.

Once formed, the boron clusters can be delivered to a tool for use in cluster boron implantation. Delivery from the reactor to the tool can be effected in any suitable manner. Where the reactor is adjacent to or within the tool, delivery may be effected simply by the cluster boron stream exiting the reactor and passing into the tool.

The invention therefore contemplates a method of forming a boron hydride precursor for cluster boron implantation, comprising providing a boron-containing gas to a reactor and inducing conversion of the boron-containing gas to higher order boron-containing clusters within the reactor.

The boron-containing gas that is subjected to reaction for formation of higher order boron species can be selected from diborane, pentaborane, and any other suitable boron source reagents, including mixtures of two or more of such source reagent species.

In various embodiments of the invention, the reactor is selected from among heated reactors, catalytic reactors, heated catalytic reactors, UV lamps, reactors containing an electric, microwave or radio frequency discharge or plasma, packed reactors, multiple stage heated reactors, hot plates, high pressure reactors, and concentric tubular reactors. The reactor can further comprise a catalyst, e.g., iron, aluminum, copper, alumina, platinum, boron, carbon, and activated carbon. The induction of higher order boron-containing clusters can comprise heating the boron-containing gas within the reactor, providing thermal of plasma energy to the boron-containing gas within the reactor, providing multiple stage temperature grading to the boron-containing gas within the reactor, performing the reaction for induction of higher order boron-containing clusters at a temperature in a range of from room temperature to 400° C., and/or pressure in a range of vacuum to 1000 psi. The reaction can be carried out with addition of further reactant(s) to the reactor prior to or concurrent with the formation of higher order boron-containing clusters.

In one aspect, the invention contemplates a method of supplying a boron hydride precursor for cluster boron implantation, involving providing a boron-containing gas to a reactor, inducing conversion of the boron-containing gas to higher order boron-containing clusters within the reactor and supplying the higher order boron-containing clusters to a tool for cluster boron implantation.

In another aspect, the invention provides a boron hydride precursor source including a boron-containing gas source, a reactor, and a transfer line or other flow circuitry interconnecting the boron-containing gas source and the reactor, optionally containing a mass or pressure controller therein.

It will be recognized that a wide variety of specific arrangements may be employed for formation of the higher order boron species for delivery to a utilization facility for such species. The utilization facility can be of any suitable type, e.g., including microelectronic device manufacturing tools such as ion implanters, deposition chambers, etc.

Thus, while the invention has been described herein with reference to various specific embodiments, it will be appreciated that the invention is not thus limited, and extends to and encompasses various other modifications and embodiments, as will be appreciated by those ordinarily skilled in the art. Accordingly, the invention is intended to be broadly construed and interpreted, in accordance with the ensuing claims.

What is claimed is:

1. A method of implanting boron-containing ions, comprising:
   ionizing a boron-containing composition comprising $B_2F_4$ under ionization conditions to generate boron-containing ions; and
   accelerating the boron-containing ions by electric field to implant boron-containing ions in a substrate,
   wherein the ionizing is conducted in a vacuum chamber containing an ion source and wherein another fluorine-containing species is introduced to said ionizing, to assist with cleaning of the vacuum chamber during said ionizing, and wherein the ionizing is conducted at an arc voltage of less than 100 volts.

2. The method of claim 1, wherein the substrate comprises a microelectronic device substrate.

3. The method of claim 1, wherein the boron-containing ions are implanted in the substrate to form a shallow p-type doped region in the substrate.

4. The method of claim 1, wherein the boron-containing ions are implanted in the substrate to form a p-type doped region in the substrate.

5. The method of claim 1, wherein noble gas is mixed with the boron-containing composition in said ionizing or prior to said ionizing.

6. The method of claim 1, wherein said ionizing comprises cleavage of $B_2F_4$ at its B—B bond.

7. The method of claim 6, wherein the cleavage of $B_2F_4$ at its B—B bond produces $BF_2^+$ molecular ions as said boron-containing ions, and said $BF_2^+$ molecular ions are implanted in the substrate.

8. The method of claim 1, wherein the boron-containing composition further comprises $BF_3$.

9. The method of claim 8, wherein the boron-containing composition further comprises less than 20 percent by weight $BF_3$.

10. The method of claim 5, wherein the noble gas is neon, argon, or krypton.

11. The method of claim 1, wherein ionizing efficiency of the ionizing of said $B_2F_4$ is at least 15%, and said ionizing is conducted at an arc voltage of less than 70 volts.

12. The method of claim 1, further comprising annealing the substrate subsequent to implanting the boron-containing-ions in the substrate.

13. The method of claim 1, wherein said substrate comprises an article selected from the group consisting of semiconductor substrates, substrates for flat panel displays, and substrates for microelectromechanical systems (MEMS).

14. The method of claim 1, wherein said boron-containing composition is contained in a vessel in a gas box joined by a transfer line to a semiconductor tool in which the boron-containing ions are implanted in the substrate.

15. The method of claim 14, wherein the transfer line contains a mass or pressure controller therein to modulate flow of the boron-containing composition to the semiconductor tool.

16. A method of implanting boron-containing ions, comprising:
   ionizing two different boron-containing compounds to generate boron-containing ions; and
   implanting the boron-containing ions in a substrate,
   wherein said boron-containing compounds comprise $B_2F_4$ and wherein another fluorine-containing species is introduced to said ionizing, and wherein the boron-containing compounds comprise a compound selected from the group consisting of nido-carboranes selected from the group consisting of $CB_5H_9$, $C_2B_4H_8$, $C_3B_3H_7$, $C_4B_2H_6$ and $C_2B_3H_7$; open cage carboranes selected from the group consisting of $C_2B_3H_7$, $CB_5H_9$, $C_2B_4H_8$, $C_3B_3H_7$, $C_4B_2H_6$ and $C_2B_7H_{13}$; and closo-carboranes selected from the group consisting of $C_2B_3H_5$, $C_2B_4H_6$, $C_2B_5H_7$, $CB_5H_7$, $C_2B_6H_8$, $C_2B_7H_9$, $C_2B_8H_{10}$, $C_2B_9H_{11}$ and $C_2B_{10}H_{12}$.

17. The method of claim 16, wherein said ionizing is carried out using the ion source and said ion source comprises an ion source selected from the group consisting of ion sources of types using thermoelectrodes and powered by an electric arc, microwave types of ion sources using a magnetron, indirectly heated cathode sources, and RF plasma sources.

18. The method of claim 16, wherein noble gas is introduced to said ionizing.

19. The method of claim 18, wherein said noble gas is selected from the group consisting of neon and argon.

20. The method of claim 18, wherein said noble gas is selected from the group consisting of krypton and xenon.

* * * * *